US011815634B2

United States Patent
Zanchi et al.

(10) Patent No.: US 11,815,634 B2
(45) Date of Patent: Nov. 14, 2023

(54) RADIATION PARTICLE STRIKE DETECTION

(71) Applicant: The Boeing Company, Chicago, IL (US)

(72) Inventors: Alfio Zanchi, Seattle, WA (US); David Box, Renton, WA (US)

(73) Assignee: The Boeing Company, Arlington, VA (US)

( * ) Notice: Subject to any disclaimer, the term of this patent is extended or adjusted under 35 U.S.C. 154(b) by 0 days.

(21) Appl. No.: 17/649,553

(22) Filed: Jan. 31, 2022

(65) Prior Publication Data

US 2023/0243984 A1  Aug. 3, 2023

(51) Int. Cl.
*G01T 1/24* (2006.01)
*H01L 31/08* (2006.01)

(52) U.S. Cl.
CPC .............. *G01T 1/24* (2013.01); *H01L 31/085* (2013.01)

(58) Field of Classification Search
CPC ................................. G01T 1/24; H01L 31/085
See application file for complete search history.

(56) References Cited

U.S. PATENT DOCUMENTS

| | | | |
|---|---|---|---|
| 5,331,164 A * | 7/1994 | Buehler | G11C 11/4125 257/E27.099 |
| 6,075,261 A | 6/2000 | Hossain et al. | |
| 6,959,255 B2 | 10/2005 | Ye et al. | |
| 2004/0227094 A1 * | 11/2004 | Tompa | G01T 1/245 250/370.01 |
| 2006/0186342 A1 * | 8/2006 | Burger | G01T 1/245 250/370.01 |
| 2008/0308747 A1 * | 12/2008 | Gordon | G01T 1/04 250/472.1 |

FOREIGN PATENT DOCUMENTS

WO  2021011395 A1  1/2021

OTHER PUBLICATIONS

"Nuclear Event Detectors," Data Device Corporation Website, Available Online at https://www.ddc-web.com/en/power/nucleareventdetectors, Available as Early as Apr. 10, 2019, 4 pages.
(Continued)

*Primary Examiner* — Hugh Maupin
(74) *Attorney, Agent, or Firm* — Alleman Hall Creasman & Tuttle LLP

(57) ABSTRACT

A radiation particle strike detection system is disclosed. The radiation particle strike detection system includes a radiation particle detector and a controller coupled to the radiation particle detector. The radiation particle detector is overlayed on at least one surface of a payload that is sensitive to interaction with radiation particles. The radiation particle detector is configured to undergo a change in state responsive to a radiation particle strike at a location on the radiation particle detector. The controller is configured to 1) monitor a state of the radiation particle detector; 2) detect a radiation particle strike on the radiation particle detector based on a change in state of the radiation particle detector; and 3) determine a location and time of the radiation particle strike on the radiation particle detector based on the change in state of the particle detector.

20 Claims, 7 Drawing Sheets

(56) References Cited

OTHER PUBLICATIONS

Koch, C. et al., "Neuromorphic vision chips," IEEE Spectrum, May 1996, 9 pages.
Mian, A. et al., "The van der Pauw Stress Sensor," IEEE Sensors Journal, vol. 6, No. 2, Apr. 2006, 17 pages.
"Nuclear Event Detector," APITech Website, Available Online at https://www.apitech.com/products/microelectronic-solutions/nuclear-event-detector/, Available as Early as Mar. 6, 2021, 2 pages.
"Space Micro Inc.," Space Micro Inc. Website, Available Online at https://www.spacemicro.com/products/, Available as Early as Nov. 23, 2020, 5 pages.
European Patent Office, Extended European Search Report Issued in Application No. 23153099.9, dated Jun. 29, 2023, Italy, 6 pages.

\* cited by examiner

RADIATION PARTICLE STRIKE DETECTION

FIELD

The present disclosure relates generally to the field of radiation detection, and more specifically to detecting a location of a radiation particle strike on electronic circuits or other payloads in real-time.

BACKGROUND

A radiation particle strike on a payload can take multiple forms. Non-limiting examples of different types of radiation particles that may strike or otherwise interact with a payload include heavy ions, alpha particles, low and high-energy proton emissions, and flash X-rays. In many cases, a radiation particle strike can negatively affect operation of the payload. Electronic circuits and micromechanical devices are non-limiting examples of payloads that can be negatively affected by a radiation particle strike. In one example where a radiation particle strikes an electronic circuit, a signal being processed by the electronic circuit at the time of the radiation particle strike can be corrupted. The corrupted signal can cause data errors and/or incorrect processing by the electronic circuit.

SUMMARY

A radiation particle strike detection system is disclosed. The radiation particle strike detection system includes a radiation particle detector and a controller coupled to the radiation particle detector. The radiation particle detector is overlayed on at least one surface of a payload that is sensitive to interaction with radiation particles. The radiation particle detector is configured to undergo a change in state responsive to a radiation particle strike at a location on the radiation particle detector. The controller is configured to 1) monitor a state of the radiation particle detector; 2) detect a radiation particle strike on the radiation particle detector based on a change in state of the radiation particle detector; and 3) determine a location and time of the radiation particle strike on the radiation particle detector based on the change in state of the particle detector.

The features, functions, and advantages that have been discussed can be achieved independently in various embodiments or may be combined in yet other embodiments, further details of which can be seen with reference to the following description and drawings.

DETAILED DESCRIPTION

Figure 1:
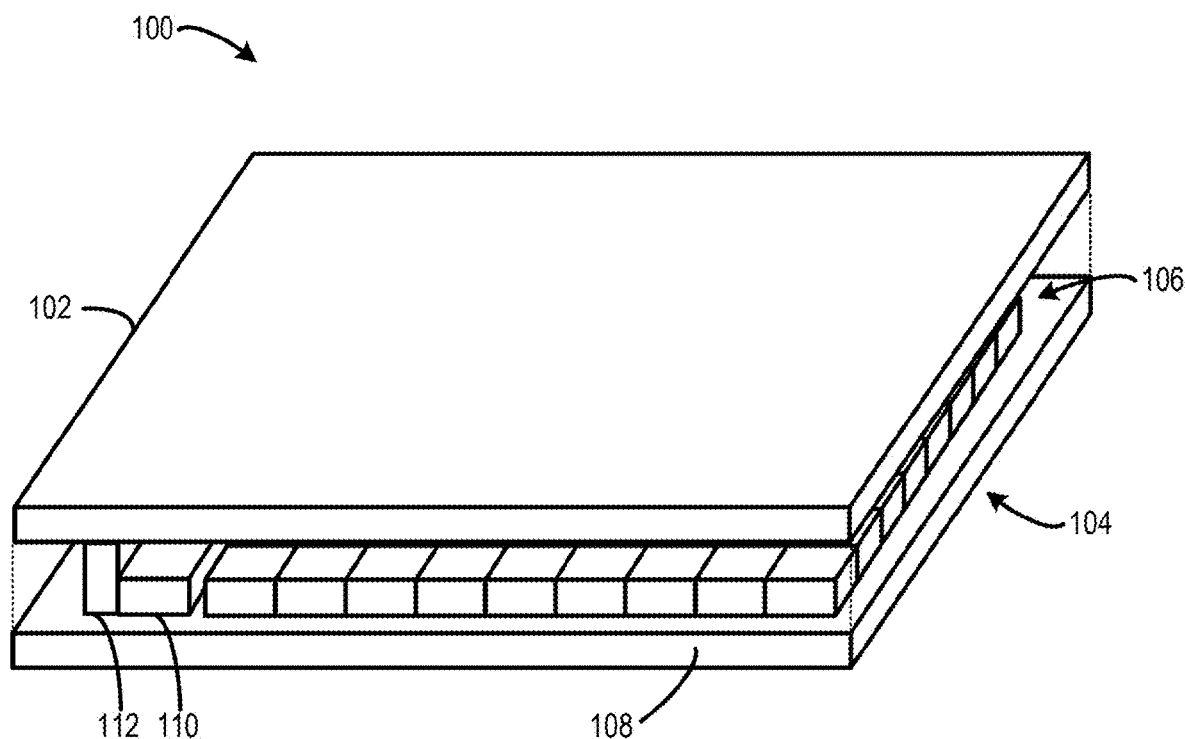
FIGS. 1 and 2 show an example embodiment of a radiation particle strike detection system including a two-dimensional (2D) radiation particle detector.

A radiation particle strike can often negatively affect operation of a payload. In response to such vulnerability, various countermeasures have been devised to counteract a radiation particle strike. In some examples, a payload can be radiation hardened by design (RHBD). For example, in the case of an electronic circuit, RHBD techniques may attempt to minimize the negative effects of radiation by way of special biasing, topologies, servo-circuits, and other radiation hardening measures. However, such RHBD techniques can result in increased power consumption, area, complexity, and cost, relative to an electronic circuit that is not RHBD.

In one example, a RHBD technique includes employing redundancy—whereby the same digital circuit is instanced multiple times within a system, for example three instances. Such redundancy assumes that a radiation event will affect only one out of the three instances of the digital circuit, and thus can be recognized by majority voting, and mitigated appropriately. However, such redundancy leads to increased complexity of the system design as well as increased area and power consumption, relative to an electronic circuit that does not employ such a redundancy RHBD technique.

In other examples, a payload can be radiation hardened by process (RHBP). Such an approach requires modifications to the manufacturing process of the payload. In the case of electronic circuits, the semiconductor fabrication process typically is modified, which can require specialized foundries and technology nodes having limited scale and device capabilities.

Further, both RHBD and RHBP techniques suffer from the limitation that they often cannot be applied to existing systems-on a chip (SoCs) or integrated circuits. Moreover, both RHBD and RHBP techniques require tailoring the design to a particular cell library and fabrication process, which dramatically raises costs relative to an electronic circuit that is not radiation hardened by design or process.

Accordingly, the present description is directed to a radiation particle strike detection system that can provide improved and/or different radiation protection. The radiation particle strike detection system includes a radiation particle detector that is overlayed on at least one surface of a payload that is sensitive to interaction with radiation particles. In some embodiments, the radiation particle detector includes a two-dimensional structure. In other embodiments, the radiation particle detector includes a three-dimensional structure that overlays a volume of the payload. The radiation particle detector is configured to undergo a change in state responsive to a radiation particle strike at a location on the radiation particle detector. A controller is coupled to the radiation particle detector. The controller is configured to 1) monitor a state of the radiation particle detector; 2) detect a radiation particle strike on the radiation particle detector based on a change in state of the radiation particle detector; and 3) determine a location of the radiation particle strike on the radiation particle detector based on the change in state of the particle detector.

The radiation particle strike detection system provides a unified paradigm not for the prevention, but rather for the detection of radiation events, which includes determining a location and time of the radiation particle strike. Once an event is detected and the location is identified, a state of the payload can be interpreted a posteriori, and mitigation operations can be performed as needed based on the data collected pertaining to the radiation particle strike. Therefore, the radiation particle strike detection system supersedes the need for RHBD and/or RHBP of the payload. Further, the radiation particle strike detection system can be used with a payload that is designed in a standard fashion (e.g., a commercial off-the-shelf component) with little or no degree of radiation hardness. Moreover, the radiation particle strike detection system provides a suitable substitute for many radiation-hardened architecture features, while providing reductions in power consumption, area, complexity, and cost, relative to a radiation hardened payload.

Figure 2:
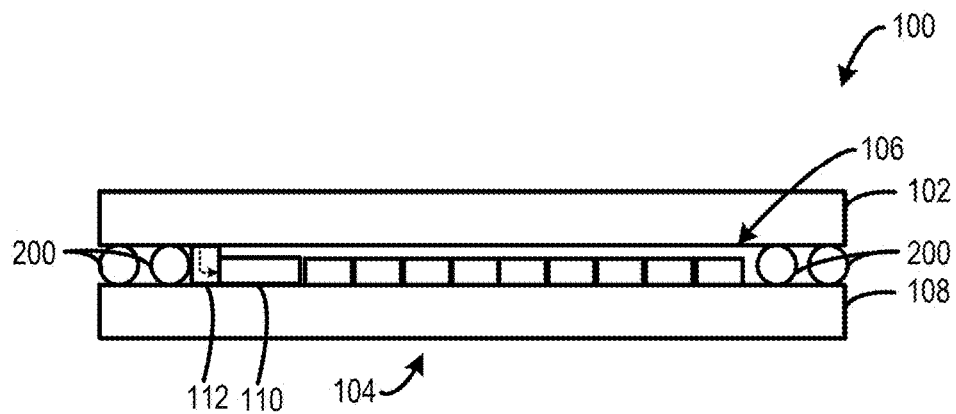

FIGS. 1 and 2 show an example embodiment of a radiation particle strike detection system 100 including a two-dimensional (2D) radiation particle detector 102. The 2D radiation particle detector 102 is overlayed on at least one surface of a payload 104 that is sensitive to interaction with radiation particles. The 2D radiation particle detector 102 is configured to undergo a change in state responsive to a radiation particle strike at a location on the 2D radiation particle detector 102.

The payload 104 may take any suitable form of element that is sensitive to interaction with radiation particles. In some cases, such interaction may negatively affect operation of the payload 104. In some examples, the payload 104 may include electronic components, such as electronic circuits, integrated circuits (ICs), systems on a chip (SoCs), microprocessors, microcontrollers, and/or discrete electronic components (e.g., resistors, capacitors, inductors). In some examples, the payload 104 may include electrical components. In some examples, the payload 104 may include micromechanical components. In some examples, the payload 104 may include microchemical components. In some examples, the payload 104 may include a combination of the different components described above. In the illustrated embodiment, by way of example the payload 104 includes a plurality of electronic components 106 positioned on a printed circuit board (PCB) 108.

The 2D radiation particle detector 102 may assume any suitable size and/or shape. In some examples, the 2D radiation particle detector 102 may be configured to align with a 2D physical footprint of the payload 104. In other examples, the 2D radiation particle detector 102 may be sized larger than a 2D physical footprint of the payload 104, such that the 2D radiation particle detector 102 extends beyond a 2D physical footprint of the payload 104 and provides additional radiation particle strike detection capability (e.g., radiation particles that intersect the payload from shallower angles). In some examples where the 2D radiation particle detector 102 extends beyond the 2D physical footprint of the payload 104, the radiation particle strike detection system 100 optionally may include a mount or structural support (not shown) to physically support the 2D radiation particle detector 102 and couple the 2D radiation particle detector 102 to the PCB 108. In the illustrated embodiment, the 2D radiation particle detector 102 is configured to match a shape of the PCB 108. In other embodiments, the 2D radiation particle detector 102 can be sized to have a surface area that is smaller or larger than the surface area of the PCB 108.

The 2D radiation particle detector 102 may be overlayed on the payload 104 in any suitable manner. In some examples, the 2D radiation particle detector 102 can be placed on top of, or below a side of the payload 104 having the largest surface area. In such examples, radiation particles that intersect a side of the payload 104 having a smaller surface area (e.g., a side that is orthogonal to the side having the largest surface area) are less likely to occur and less likely to cause undesired behavior by the payload 104. In some examples, the 2D radiation particle detector 102 can be stretched over the plurality of electronic components 106. In other examples, the 2D radiation particle detector 102 can be manufactured over the planar material of the PCB 108. In still other examples, the 2D radiation particle detector 102 can be coupled to the PCB 108 via interposers as a continuum surface, which will be discussed in further detail below with reference to FIGS. 3 and 4. The latter case for instance technologically can apply not only to the discrete case of a PCB, but to an equivalent multi-chip system in a package (SiP), or multiple silicon dice assembled within a multi-chip module (MCM), or even to a single integrated circuit (IC) implemented on a silicon die. In still other examples, the 2D radiation particle detector 102 can include a finite mesh structure that is coupled to the PCB 108, which will be discussed in further detail below with reference to FIG. 5. In the illustrated embodiment, the 2D radiation particle detector 102 is coupled to the PCB 108 via a plurality of micro-bumps 200 (shown in FIG. 2). The 2D radiation particle detector 102 can be coupled to the PCB 108 using any suitable coupling technique.

A controller 110 is mounted on the PCB 108 and coupled to the 2D radiation particle detector 102 via a conduit 112 that carries signals between the 2D radiation particle detector 102 and the controller 110. The controller 110 includes one or more physical hardware devices configured to execute instructions. Such instructions may be implemented to perform a task, implement a data type, transform the state of one or more components, achieve a technical effect, or otherwise arrive at a desired result. Additionally or alternatively, the controller 110 may include one or more hardware logic circuits or firmware devices configured to execute hardware-implemented logic or firmware instructions. In some embodiments, the controller 110 may include one or more hardware-logic components, such as field-programmable gate arrays (FPGAs), program- and application-specific integrated circuits (PASICs/ASICs), program- and application-specific standard products (PSSP/ASSPs), systems-on-a-chip (SOCs), and programmable logic devices (PLDs), for example.

The controller 110 is configured to monitor a state of the 2D radiation particle detector 102. The controller 110 is configured to detect a radiation particle strike on the radiation particle detector based on a change in state of the radiation particle detector observed from said monitoring. Further, the controller 110 is configured to determine a location and time of the radiation particle strike on the 2D radiation particle detector 102 based on the change in state of the 2D radiation particle detector 102.

In some embodiments, the controller 110 may be configured to perform a mitigation operation based on the radiation particle strike. In one example, the controller 110 may identify a component corresponding to the location of the radiation particle strike and command a re-set of the operating state of the identified component. In some examples, re-setting may include controlling the identified component to re-generate/re-process a signal that was initially generated at the time of the radiation particle strike. Such a mitigation operation may prevent a corrupted signal from causing data errors from being processed by the payload 104 or another device. In other examples, the controller 110 may test the functionality of the identified component, and disable operation of the identified component if the component is not functioning properly after the radiation particle strike. Such a mitigation operation may prevent incorrect processing from being performed by the degraded component.

In some embodiments, the controller 110 may be configured to output radiation particle strike data indicating an occurrence of a radiation particle strike and a location of the radiation particle strike on the radiation particle detector 102. In some examples, the controller 110 outputs the radiation particle strike data to the payload 104, and the payload 104 performs one or more mitigation operations based on the radiation particle strike data.

Any suitable mitigation operation(s) may be performed by the controller 110, the payload 104, and/or another monitoring device based on detection of a radiation particle strike on the 2D radiation particle detector 102.

In some embodiments, the controller 110 may be configured to govern the behavior of the 2D radiation particle detector 102. For example, upon detection of a radiation particle strike, the controller 110 may issue a re-set signal to the 2D radiation particle strike detector 102 to re-set a state of the 2D radiation particle strike detector 102 to an unperturbed equilibrium or default state, so that subsequent radiation particle strikes can be detected. In other embodiments, the 2D radiation particle strike detector 102 may be configured to naturally relapse back to the unperturbed equilibrium or default state.

In the illustrated embodiment, radiation particle strike sensing performed by the 2D radiation particle detector 102 is electronic in nature. In other embodiments, the 2D radiation particle detector 102 may be configured to perform radiation sensing that is electrical, or magnetic, or electro-chemical in nature based on monitoring an electrical, magnetic, or electro-chemical state of the 2D radiation particle detector 102 and detecting a radiation particle strike based on observing a change in state of the 2D radiation particle detector 102.

Figure 3:
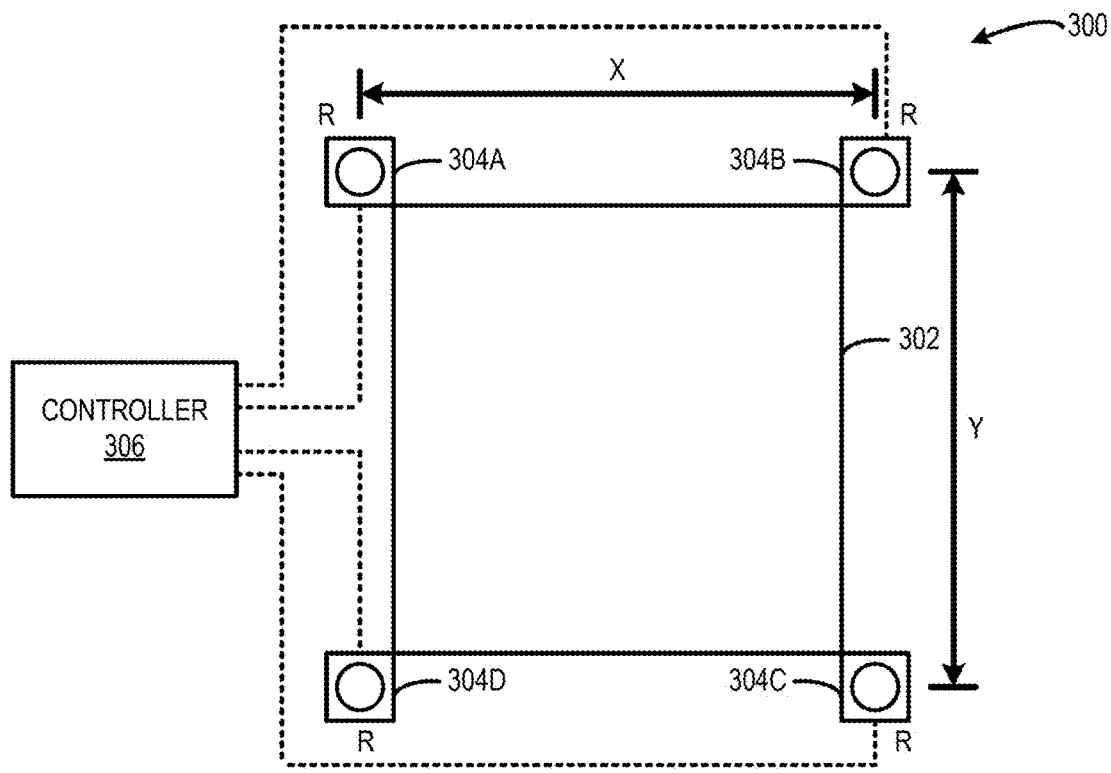
FIGS. 3 and 4 show an example embodiment of a radiation particle detector including a van der Pauw semiconductor resistor structure.
Figure 4:
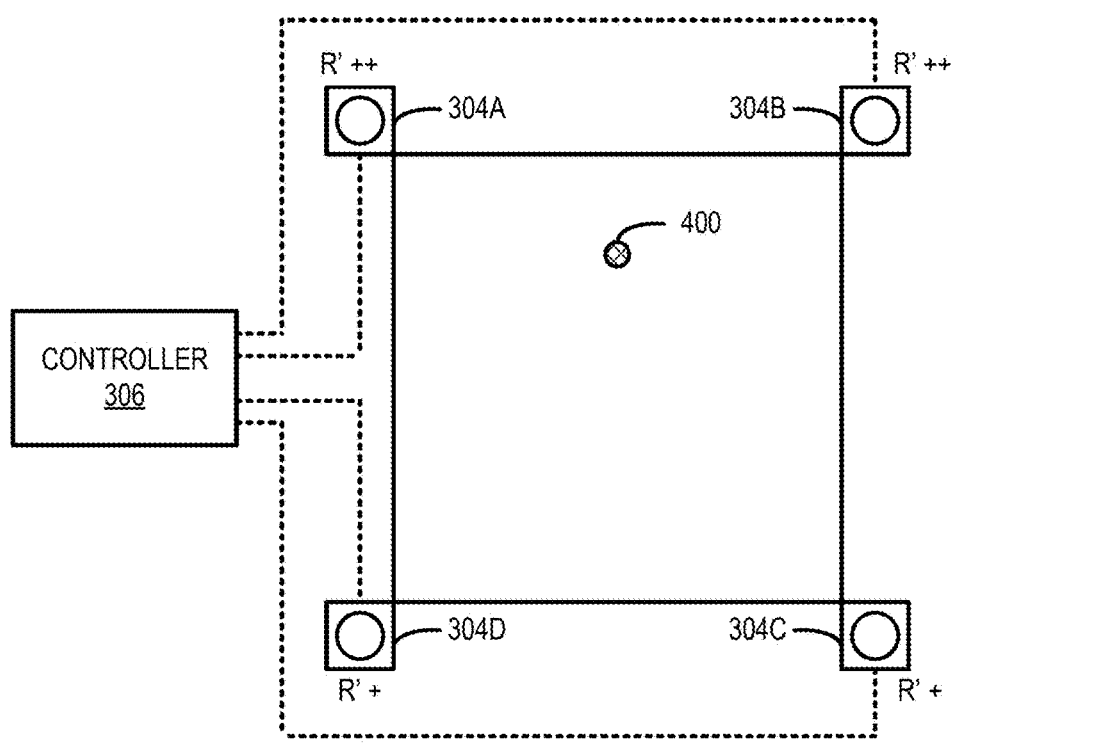

The 2D radiation particle detector 102 may have different surface structures in different embodiments. In some embodiments, the 2D radiation particle detector 102 may have a continuous surface structure. FIGS. 3 and 4 show an example embodiment of a 2D radiation particle detector having a continuous surface structure that includes a van der Pauw semiconductor resistor structure 300. The van der Pauw semiconductor resistor structure 300 includes a distributed semiconductor resistor sheet 302 electrically connected to a plurality of terminals 304 (e.g., 304A, 304B, 304C, 304D) which can be configured to measure a resistance through various combinations of current and voltage forcing and sensing.

The van der Pauw structure 300 may include any suitable number of resistance-measuring terminals. Further, the plurality of terminals 304 may have any suitable arrangement. In some examples, the plurality of terminals 304 may be arranged as a matrix. For example, the 4-terminal tile of the illustrated example could be modularly replicated with terminals being shared among adjacent tiles. By virtue of uniformity and neglecting any edge effects, such an arrangement can produce a uniform resistance readout across all tiles/terminal quads. A local perturbation from a radiation particle strike such as a heavy ion would cause a local deviation of the resistance value; deviation which would progressively reduce the further away from the hit location the readout gets, across the different tiles. In other examples, the plurality of terminals may be arranged according to other geometries. For example, a straight and a diagonal sensing surfaces could be combined to form a diamond patterned van der Pauw structure.

The distributed resistor sheet 302 is configured such that local perturbation to the molecular arrangement of the material of the distributed resistor sheet 302 will upset the local electric field responsible for current flow, and—at least momentarily—alter its resistive properties. In the illustrated example, each of four terminals 304 is electrically connected to a different corner of the distributed resistor sheet 302. A location of a radiation particle strike on the distributed resistor sheet 302 is determined based on differences between the unperturbed expected resistances, and the resistances measured via the four terminals 304.

In FIG. 3, each of the configurations of terminals 304 used to measure the resistance according to van der Pauw (using different nodes for current and voltage forcing and sensing) returns the same expected value (R) of the distributed resistor sheet 302 in an unperturbed or default state, when no radiation particle strike has occurred on the distributed resistor sheet 302. In FIG. 4, an intersecting ion track of a radiation particle strike 400 upsets a charge state of the distributed resistor sheet 302, whereby a carrier flow inside the distributed resistor sheet 302 is temporarily altered and modifies the effective resistance observed for each configuration of the plurality of terminals 304. Thus, depending on how close or peripheral the location of the radiation particle strike 400 is with respect to a particular terminal 304, the perturbation to a certain resistance value could be larger or smaller. In the illustrated example, since the radiation particle strike 400 occurs at a location on the distributed resistor sheet 302 that is closer to the terminals 304A and 304B, the resistances (R++) measured by configuring these terminals as current sources are smaller than the resistances measured (R+) by configuring the terminals 304C and 304D as current sources, since the latter are further away from the location of the radiation particle strike 400, and are hence less affected by the local extra charge deposited by the semiconductor interaction with radiation. Considering the resistance values which stem from all combinations of terminals can be most precise, but is also more expensive to implement. As an alternative, in a matrix terminal arrangement only one force/sense terminal configuration can be adopted for all tiles; and resistance variations across tiles, rather than across terminal configurations within the same tile, can more simply be processed to locate a radiation strike whenever lesser accuracy is acceptable. The accuracy of the determination of the location of a radiation particle strike may indeed correlate to a density or granularity of a distribution of resistance sensing terminals in the van der Pauw semiconductor resistor structure 300. In particular, as a number of terminals included in the van der Pauw semiconductor resistor structure 300 increases, a location determination accuracy also increases.

The plurality of terminals 304 are electrically connected to a controller 306. For example, the controller 306 may be representative of the controller 110 shown in FIGS. 1 and 2. In one example, the terminals 304 are routed to current sensors, such as Trans-Impedance Amplifiers (TIAs), which convert the currents as sensed into output voltages that may be digitized by way of a simple threshold comparator of the controller 110, to generate a simple resistance evaluation circuit.

The controller 306 may be configured to determine a location of a radiation particle strike based on differences between expected resistances and the resistances measured via the plurality of terminals 304. In particular, the controller 306 correlates a distance of the location of the radiation particle strike on the distributed resistor sheet 302 relative to a location of each of the plurality of terminal 304, based on the difference between the expected resistances and the measured resistances determined with one, or multiple, terminal current and voltage forcing and sensing configurations.

In some examples, the controller 306 may detect a radiation particle strike based on differences between expected resistances and measured resistances being greater than a threshold value. In other examples, the controller 306 can employ a plurality of different detection thresholds that are used to increase the detection resolution and result in different confidence levels of detecting a radiation particle strike.

In some embodiments, at least some of the resistive sensing circuitry can be integrated into the radiation particle detector itself or wired to a multiplexer on the controller when the number of sensing pick-up points is manageable.

In some embodiments, the van der Pauw semiconductor resistor structure 300 may be implemented on a top layer of silicon interposed with some payload circuits to be protected from radiation, within a multi-level substrate of the payload. In such embodiments, doped-well type van der Pauw structures and integrated TIAs can be implemented and routed to on-chip processing units (e.g., a controller) along the perimeter of the substrate. Such an arrangement may increase an overall footprint of the payload/substrate minimally if at all.

In some embodiments, the continuous surface structure of the 2D radiation particle detector 102 includes a reverse biased p-n junction. When reverse biased, the p-n junction (or the p-i-n junction as well) can function as a detector of heavy ions. In this way, the reverse biased p-n junction can behave similar to a photodiode, detecting heavy ions instead of photons.

The various embodiments of the continuous surface structure may have different operating characteristics. The van der Pauw structure operates with a current forcing and voltage sensing (or vice-versa) and provides an "analog" resistance measurement output that correlates to a location of a radiation particle strike on the continuous surface structure. On the other hand, the reverse biased p-n junction type-detector requires a reverse bias (often several volts) that can increase power consumption of the detector. However, such a detector can exploit carrier multiplication phenomena towards a binary, 0/1 digital type of output, without requiring analog-to-digital circuitry that would otherwise increase the complexity of the detector.

Figure 5:
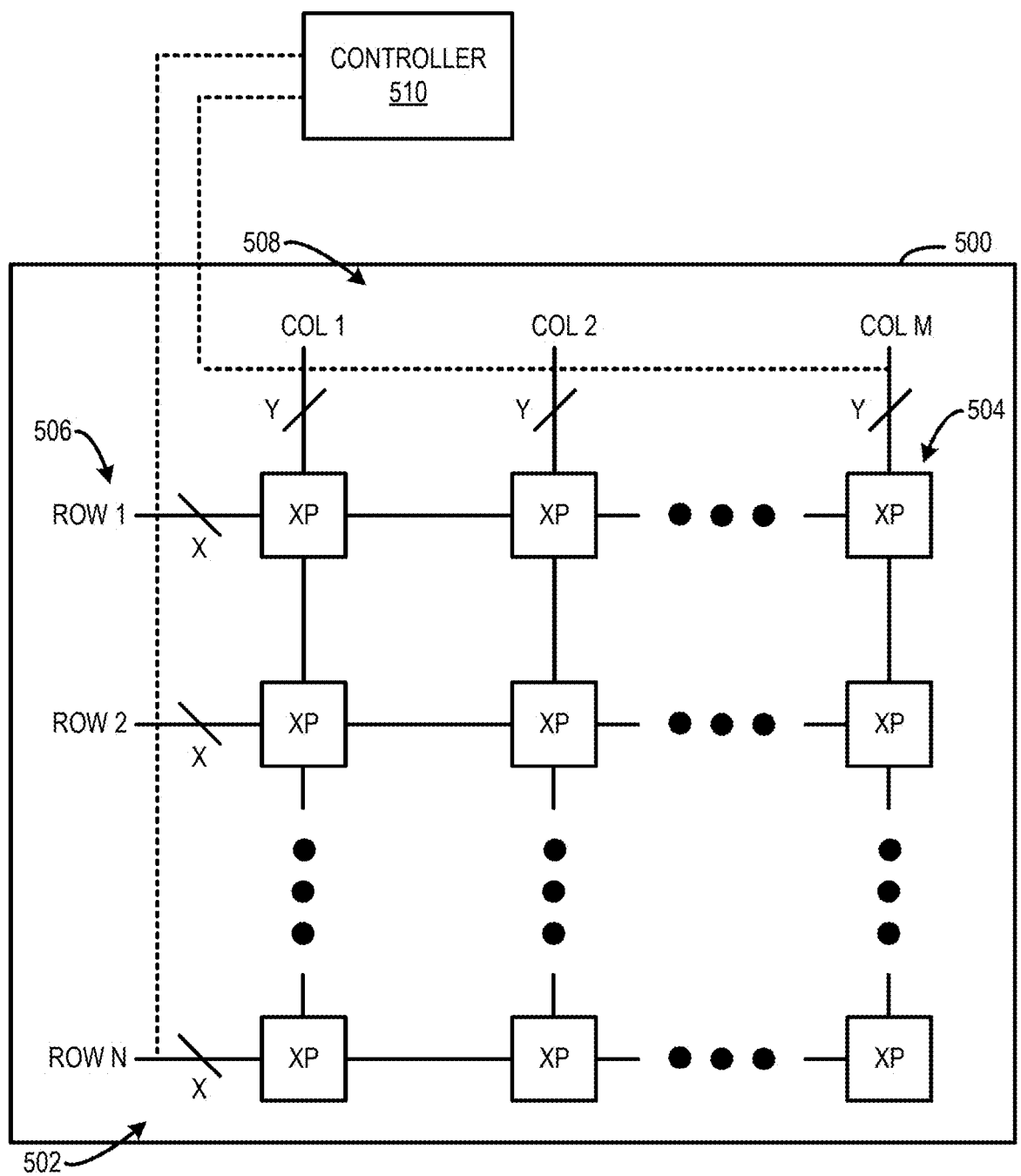
FIG. 5 shows an example embodiment of a radiation particle detector having a 2D mesh structure including a plurality of storage components.

In some embodiments, the 2D radiation particle detector 102 may have a two-dimensional mesh structure rather than a continuum structure. FIG. 5 shows an example embodiment of a radiation particle detector 500 having a 2D mesh structure 502 including a plurality of storage components 504. For example, the radiation particle detector 500 may be representative of the 2D radiation particle detector 102 shown in FIG. 1. The radiation particle detector 500 includes a plurality of row electrodes 506 and a plurality of column electrodes 508. Each of the plurality of storage components 504 is electrically connected at crossing points between the plurality of rows electrodes 506 and the plurality of column electrodes 508 of the 2D mesh structure 502. Each of the plurality of storage components 504 is configured to store a parameter value that changes based on a radiation particle strike occurring at the storage component 504. Each storage component 504 may be configured to store a parameter value in any suitable manner, including but not limited to as a resistance value (memristors or e-fuses), a charge value, etc. In some examples, the parameter value deterministically and temporarily changes to a new value based on a radiation particle passing through the storage component 504.

Each of the plurality of storage components 504 may take any suitable form. In some examples, each of the plurality of storage components 504 is an electronic storage component, such as a static or dynamic memory cell (SRAM or DRAM). In some examples, each of the plurality of storage components 504 is a magnetic storage component. In some examples, each of the plurality of storage components 504 is an electro-chemical storage component.

The plurality of row electrodes 506 and the plurality of column electrodes 508 are coupled to a controller 510. The controller 510 is configured to periodically sample parameter values stored in the plurality of storage components 504 to monitor the state of the radiation particle detector 500. In some examples, the controller 510 is configured to sample the parameter values stored in the plurality of storage components 504 by periodically polling through an electrical bus. In other examples, the controller 510 is configured to sample the parameter values stored in the plurality of storage components 504 by continuously polling on the same electrical bus, in an uninterrupted revolving fashion. In some examples, the electrical bus includes multiple digital lines. In other examples, the electrical bus includes a single multiplexed analog line.

Each of the plurality of storage components 504 is configured such that the parameter value changes back to a default value subsequent to a radiation particle strike occurring at the storage component. In some examples, the controller 510 is configured to re-set a state of a storage component 504 back to a default state in which the storage component 504 stores a default parameter value. In other examples, each of the plurality of storage components 504 is configured to automatically re-set to a default state without additional external stimulus after a designated time duration has elapsed subsequent to a radiation particle strike.

Different surface structures of the radiation particle detector have different features. For example, the 2D mesh surface structure may be easier to manufacture relative to a continuous surface structure. However, the continuous surface structure is configured such that any radiation particle interacting with the continuous surface under observation necessarily intersects with the continuous surface, and is thus detected. In the case of the 2D mesh surface structure, a radiation particle has to exactly strike a storage component in order to be detected. Thus, there are scenarios where a radiation particle can strike the payload without being detected by the 2D mesh surface structure. In order to reduce the likelihood of such scenarios, in some embodiments, the 2D radiation particle detector may include a plurality of layers of 2D mesh structures.

Figure 6:
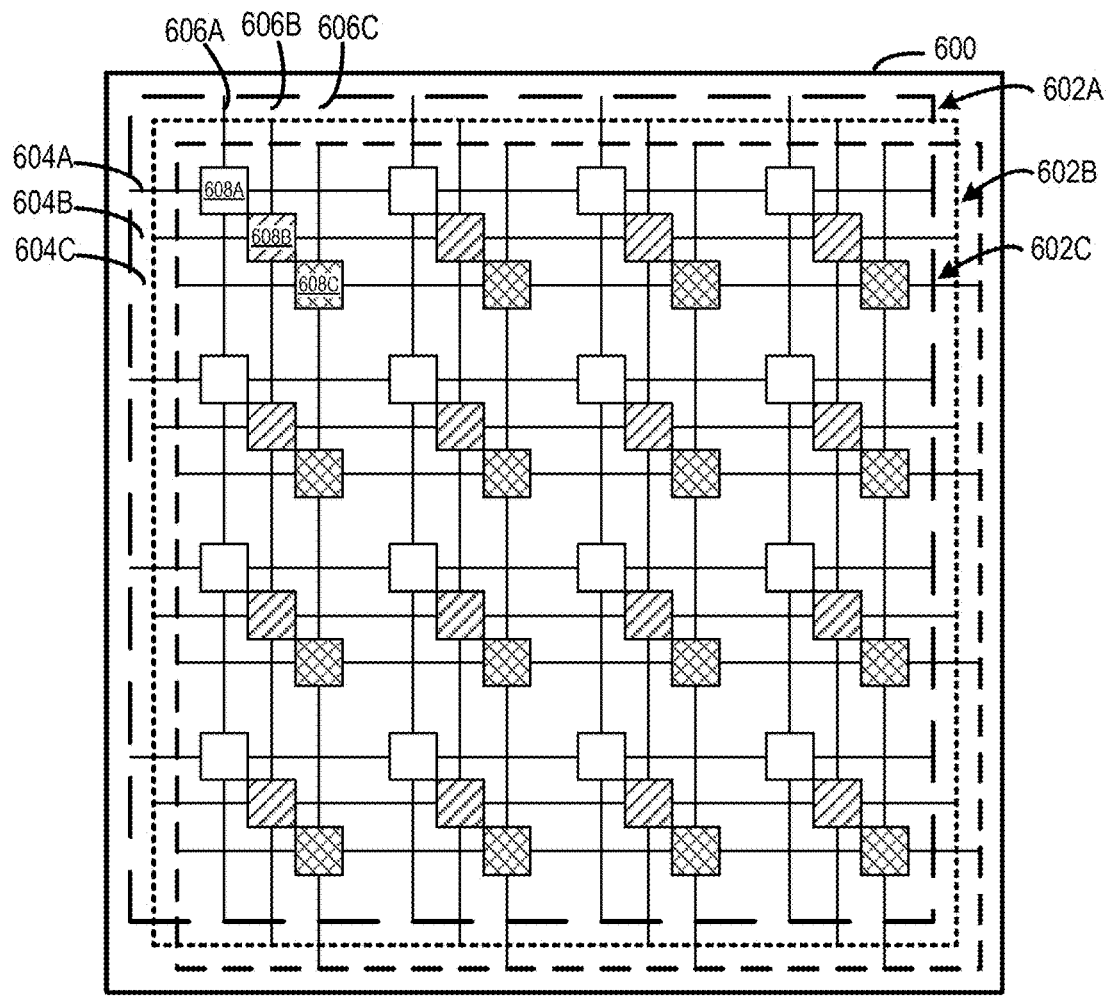
FIG. 6 shows an example embodiment of a radiation particle detector including a plurality of layers of 2D mesh structures.

FIG. 6 shows an example embodiment of a radiation particle detector 600 including a plurality of layers of 2D mesh structures 602 (e.g., 602A, 602B, 602C). Each 2D mesh structure 602 includes a plurality of row electrodes 604 (e.g., 604A, 604B, 604C), a plurality of column electrodes 6 (e.g., 606A, 606B, 606C), and a plurality of storage components 608 (e.g., 608A, 608B, 608C) electrically connected at crossing points between the plurality of rows electrodes 604 and the plurality of column electrodes 606. Each of the plurality of layers of 2D mesh structures 602 may function in the same manner as the 2D mesh structure 502 shown in FIG. 5. In the illustrated embodiment, the layers overlap each other depth-wise, while storage components in different layers are spatially offset relative to storage components in other layers of the plurality of layers. In the illustrated embodiment, storage component 608A is spatially offset relative to storage component 608B and storage component 608C. Such spatially offset storage components in the different layers may reduce or eliminate particle strike detection gaps in the radiation particle detector 600. The radiation particle detector 600 may include any suitable number of layers of 2D mesh structures to provide any suitable radiation particle strike detection area coverage.

Figure 7:
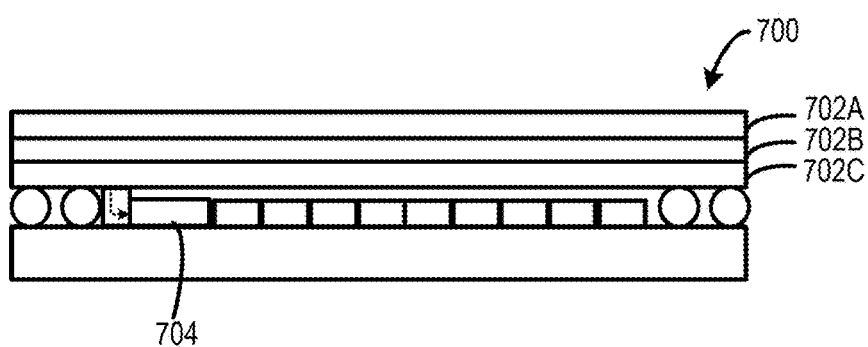
FIG. 7 shows an example embodiment of a radiation particle detector including a plurality of different continuous surface radiation particle detector layers.

In some embodiments, a radiation particle detector may include a plurality of layers of continuous surface structures. FIG. 7 shows an example embodiment of a radiation particle detector 700 including a plurality of different continuous surface radiation particle detector layers 702 (e.g., 702A, 702B, 702C). Generally, the radiation particle detector 700 may function in a similar manner to the 2D radiation particle detector 102 shown in FIGS. 1 and 2. The radiation particle detector layers 702 may include any suitable number of layers.

In some embodiments, each of the plurality of radiation particle detector layers 702 may be redundant and configured to undergo a change in state responsive to a radiation particle strike at a location on the radiation particle detector. Different spatial distributions of the electrodes over different layers, or different materials used to implement the different layers provide additional advantages in terms of granularity and/or resolution of the radiation detection. A controller 704 may monitor a state of each of the redundant layers 702 and detect a radiation particle strike on the radiation particle detector 700 based on observed changes in state of the different radiation particle detector layers 702. In some examples, the controller 704 may use the state information of the different radiation particle detector layers 702 as reinforcement of radiation particle strike detection precision. In some examples, the controller 704 may average or interpolate multiple radiation particle strike locations output from the different radiation particle detector layers 702 to increase accuracy/confidence of the location of a radiation particle strike on the radiation particle detector 700.

In some embodiments, different radiation particle detector layers 702 may include different materials that are configured to undergo a change in state responsive to different types of radiation particle strikes. For example, one layer may be more sensitive to detecting gamma rays and another layer may be more sensitive to detecting heavy ions. In this way, different types of radiation interaction events may be distinguished by different layers. The radiation particle detector 700 may include a layer configured to detect any suitable type of radiation particle/interaction.

Figure 8:
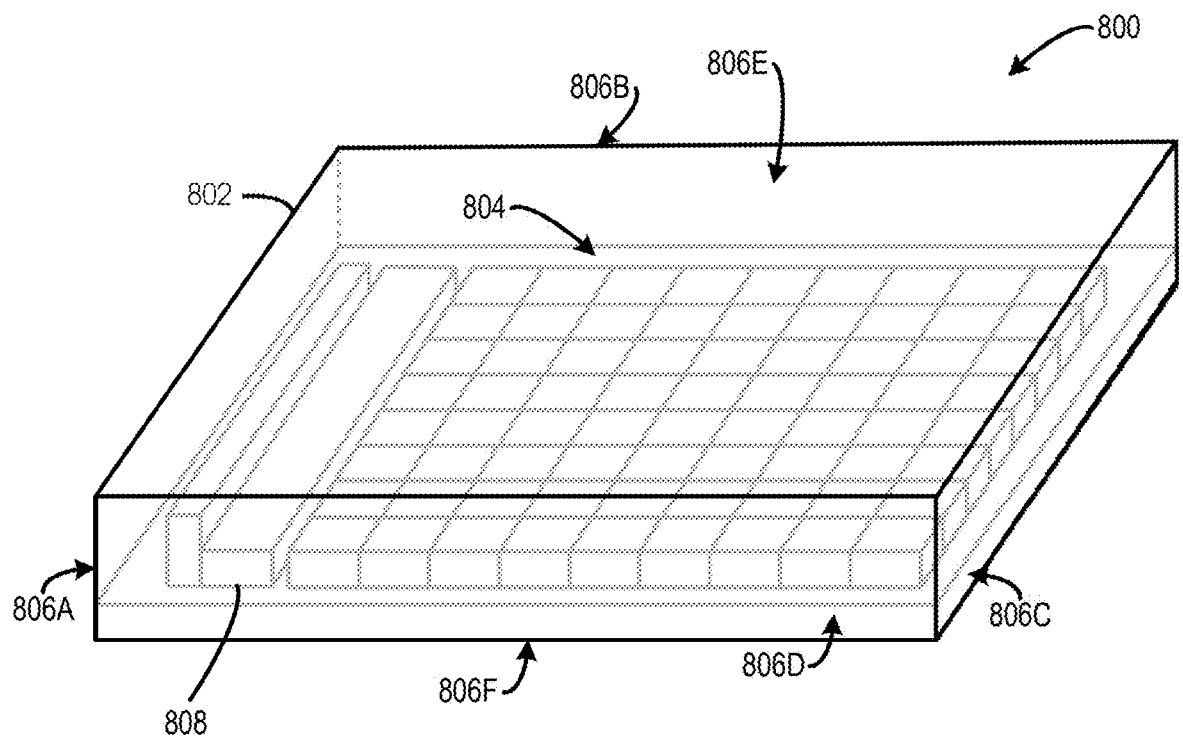
FIG. 8 shows an example embodiment of a radiation particle strike detection system including a three-dimensional (3D) radiation particle detector.

In some embodiments, the radiation particle strike detection system may include a three-dimensional structure that overlays a volume of the payload. FIG. 8 shows an example embodiment of a radiation particle strike detection system 800 including a three-dimensional (3D) radiation particle detector 802. The 3D radiation particle detector 802 overlays a volume of a payload 804. The 3D radiation particle detector 802 provides complete coverage of the payload 804 such that a radiation particle strike can be detected from any angle. The 3D radiation particle detector 802 can take any suitable form. In some embodiments, the 3D radiation particle detector 802 can form a wrapper around the payload 804. In the illustrated embodiment, the 3D radiation particle detector 802 includes a plurality of 2D surface structures 806 (e.g., sides 806A, 806B, 806C, 806D, top 806E, bottom 806F).

In some embodiments, the plurality of 2D surface structures 806 include a plurality of continuous surface structures. For example, the plurality of continuous surface structures may include distributed resistor sheets that are representative of the distributed resistor sheet 302 shown in FIGS. 3 and 4. In some such embodiments, each continuous surface structure may include one or more layers, such as the plurality of different continuous surface radiation particle detector layers 702 shown in FIG. 7.

In some embodiments, the plurality of 2D surface structures 806 include a plurality of mesh surface structures. For example, the plurality of mesh surface structures may be representative of the 2D mesh structure 502 shown in FIG. 5. In some such embodiments, each mesh surface structure may include one or more layers, such as the plurality of layers of 2D mesh structures 602 shown in FIG. 6.

The 3D radiation particle detector 802 offers the ability to detect radiation particles from multiple surfaces of detection. A controller 808 is communicatively coupled to each of the 2D surface structures of the 3D radiation particle detector 802. The controller 808 is configured to monitor the states of the plurality of 2D surface structures. The controller 808 is configured to determine a first location of a radiation particle strike on a first surface of the radiation particle detector based on the change in state of the particle detector. The controller 808 is configured to determine a second location of the radiation particle strike on a second surface of the radiation particle detector based on the change in state of the particle detector. The controller 808 is configured to determine a location of the radiation particle strike on the payload 804 based on a spatial correlation between the first location of the radiation particle strike on the first surface and the second location of the radiation particle strike on the second surface. In other words, the controller 808 correlates the entry and exit locations on the different surfaces to identify the location of the strike at the intersection of the radiation particle trajectory and the payload 804.

In some embodiments, once the location and time of the radiation particle strike has been determined, the controller 808 may enact various algorithms to mute, correct, and/or double-redundancy vote the radiation particle strike on the payload 804. The controller 808 and/or the payload 804 may employ any suitable algorithm(s) to identify and/or mitigate the radiation particle strike.

Figure 9:
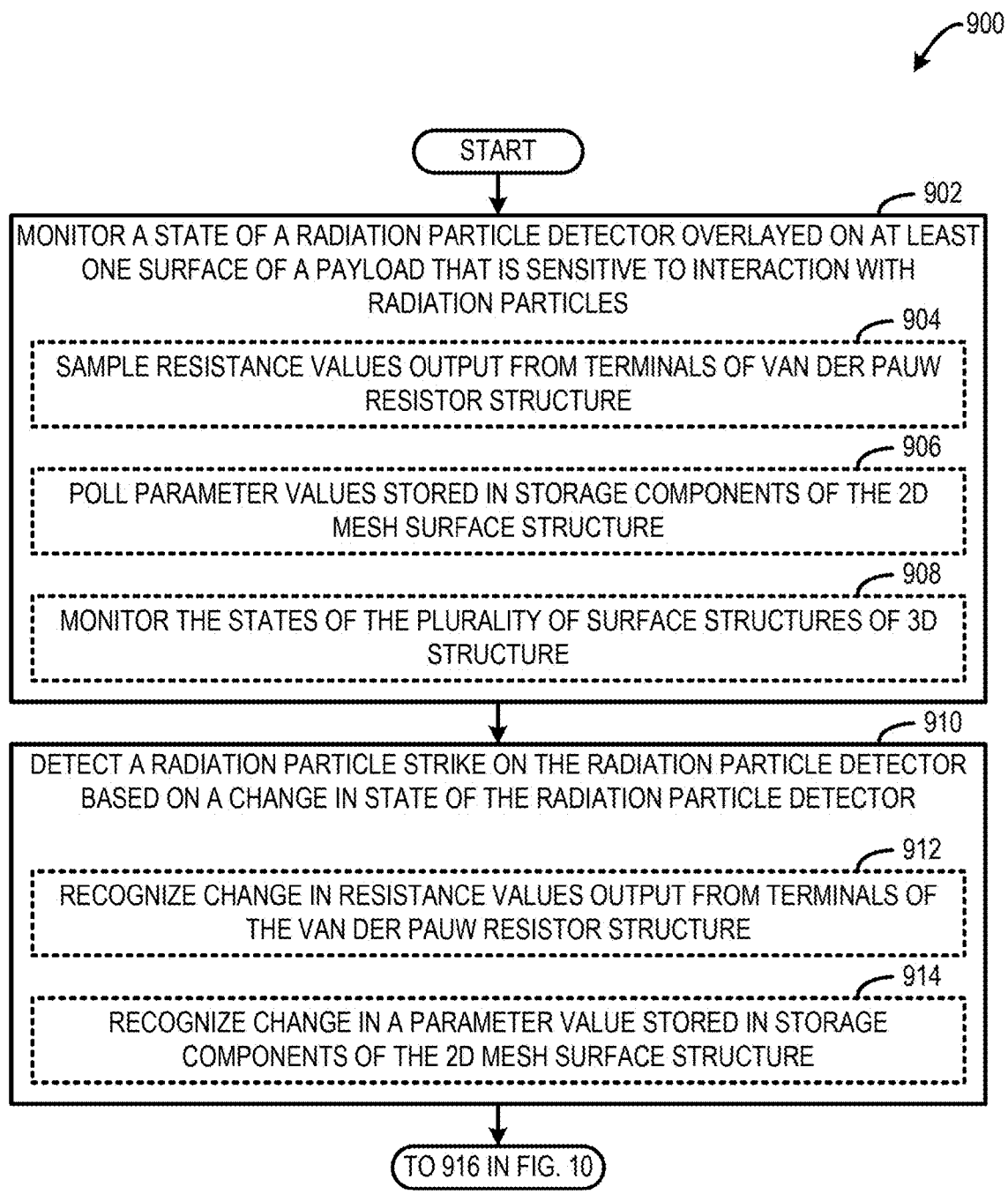
FIGS. 9-10 show an example embodiment of a radiation particle strike detection method.
Figure 10:
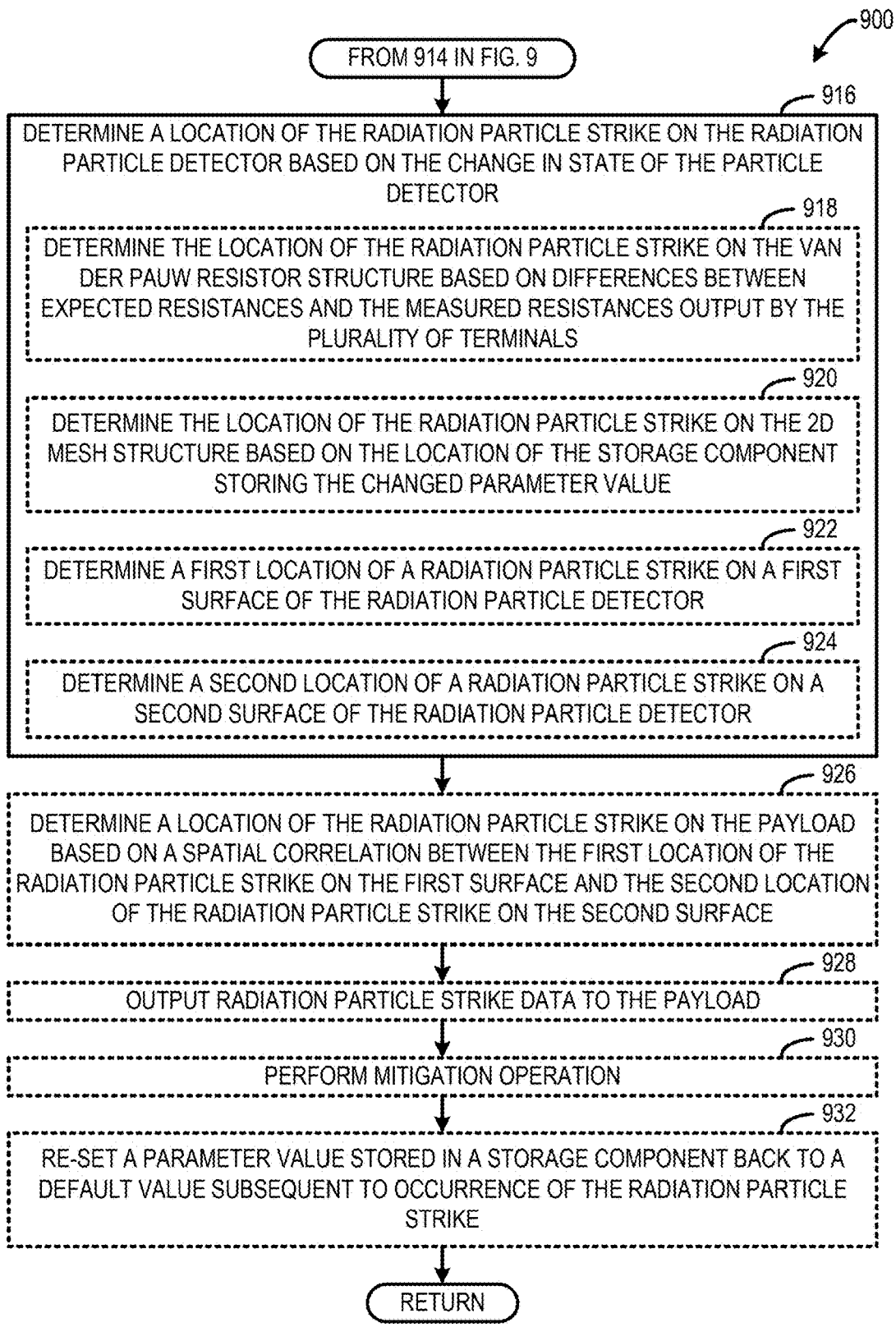

FIGS. 9-10 show an example embodiment of a radiation particle strike detection method 900. For example, the radiation particle strike detection method 900 may be performed by the radiation particle strike detection system 100 shown in FIGS. 1 and 2 and/or the radiation particle strike detection system 800 shown in FIG. 8.

In FIG. 9, at 902, the method 900 includes monitoring a state of a radiation particle detector overlayed on at least one surface of a payload that is sensitive to interaction with radiation particles. The radiation particle detector is configured to undergo a change in state responsive to a radiation particle strike at a location on the radiation particle detector.

In some embodiments, the radiation particle detector includes a 2D structure. In some embodiments, the 2D structure includes a continuous surface structure. In some embodiments, the 2D structure includes a mesh structure. In some embodiments, the radiation particle detector includes a 3D structure that that overlays a volume of the payload.

In some embodiments where the radiation particle detector includes a 2D continuous surface structure, such as the van der Pauw semiconductor resistor structure 300 shown in FIGS. 3 and 4, at 904, the method 900 may include sampling resistance values output from terminals of the van der Pauw semiconductor resistor structure.

In some embodiments where the radiation particle detector includes a 2D mesh surface structure, such as the 2D mesh structure 502 shown in FIG. 5, at 906, the method 900 may include polling parameter values stored in storage components of the 2D mesh surface structure.

In some embodiments where the radiation particle detector includes a 3D structure having a plurality of 2D surface structures, at 908, the method 900 may include monitoring the states of the plurality of surface structures of the 3D structure.

At 910, the method 900 includes detecting a radiation particle strike on the radiation particle detector based on a change in state of the radiation particle detector.

In some embodiments where the radiation particle detector includes a 2D continuous surface structure, such as a van der Pauw semiconductor resistor structure, at 912, the method 900 may include recognizing a change in resistance values output from the terminals of the van der Pauw semiconductor resistor structure and detecting the radiation particle strike based on said change.

In some embodiments where the radiation particle detector includes a 2D mesh surface structure, at 914, the method 900 may include recognizing a change in a parameter value stored in a storage component of the 2D mesh surface structure and detecting the radiation particle strike based on said change.

In FIG. 10, at 916, the method 900 includes determining a location of the radiation particle strike on the radiation particle detector based on the change in state of the particle detector.

In some embodiments where the radiation particle detector includes a 2D continuous surface structure, such as a van der Pauw semiconductor resistor structure, at 918, the method 900 may include determining the location of the radiation particle strike on the van der Pauw semiconductor resistor structure based on differences between expected resistances and measured resistances output by the plurality of terminals.

In some embodiments where the radiation particle detector includes a 2D mesh surface structure, at 920, the method 900 may include determining the location of the radiation particle strike on the 2D mesh structure based on the location of the storage component storing the changed parameter value.

In some embodiments where the radiation particle detector includes a 3D structure, at 922, the method 900 may include determining a first location of a radiation particle strike on a first surface of the radiation particle detector based on the change in state of the particle detector. At 924, the method 900 may include determining a second location of the radiation particle strike on a second surface of the radiation particle detector based on the change in state of the particle detector. At 926, the method may include determining a location of the radiation particle strike on the payload based on a spatial correlation between the first location of the radiation particle strike on the first surface and the second location of the radiation particle strike on the second surface.

In some embodiments, at 928, the method 900 may include transmitting radiation particle strike data to the payload. The radiation particle strike data may indicate the occurrence of the radiation particle strike and the location of the radiation particle strike on the radiation particle detector. Further, the payload may be configured to perform a mitigation operation based on said radiation particle strike data.

In some embodiments, at 930, the method 900 may include performing a mitigation operation to mitigate the effects of the radiation particle strike on the payload. In one example, the mitigation operation may include re-setting an operating state of the payload. In another example, the mitigation operation may include controlling the payload to re-generate a signal, such as a signal that was initially generated when the radiation particle strike occurred and thus could be corrupted.

In some embodiments, at 932, the method 900 may include re-setting a parameter value stored in a storage component back to a default value subsequent to occurrence of the radiation particle strike. Such re-setting of the parameter value may allow for the radiation particle detector to be placed in a state to detect a subsequent radiation particle strike.

The radiation particle strike detection method may be performed in place of performing RHBD and/or RHBP techniques on a payload. Further, the radiation particle strike detection method can be used with a payload that is designed in a standard fashion (e.g., a commercial off-the-shelf component) with little or no degree of radiation hardness. Moreover, the radiation particle strike detection method provides a suitable substitute for many radiation-hardened architecture features, while providing reductions in power consumption, area, complexity, and cost, relative to a radiation hardened payload.

In an example, a radiation particle strike detection system comprises a radiation particle detector overlayed on at least one surface of a payload that is sensitive to interaction with radiation particles, the radiation particle detector configured to undergo a change in state responsive to a radiation particle strike at a location on the radiation particle detector, and a controller coupled to the radiation particle detector and configured to monitor a state of the radiation particle detector, detect a radiation particle strike on the radiation particle detector based on a change in state of the radiation particle detector, and determine a location and time of the radiation particle strike on the radiation particle detector based on the change in state of the particle detector. In this example and/or other examples, the controller may be configured to output radiation particle strike data indicating occurrence of the radiation particle strike and the location of the radiation particle strike on the radiation particle detector. In this example and/or other examples, the radiation particle detector may comprise a two-dimensional continuous surface structure. In this example and/or other examples, the two-dimensional continuous surface structure may comprise a van der Pauw semiconductor resistor structure comprising a plurality of terminals configured to measure a resistance, and the location of the radiation particle strike on the van der Pauw semiconductor resistor structure may be determined based on differences between expected resistances and the resistances measured via the plurality of terminals. In this example and/or other examples, a difference between an expected resistance and a measured resistance may be correlated to a distance between the location of the radiation particle strike on the van der Pauw semiconductor resistor structure and a location of a terminal of the plurality of terminals. In this example and/or other examples, the two-dimensional continuous surface structure may comprise a reverse biased p-n junction. In this example and/or other examples, the radiation particle detector may comprise a two-dimensional mesh structure comprising a plurality of storage components each configured to store a parameter value that changes based on a radiation particle strike occurring at the storage component. In this example and/or other examples, each of the plurality of storage components may be configured such that the parameter value changes back to a default value after a designated time duration has elapsed subsequent to a radiation particle strike occurring at the storage component. In this example and/or other examples, the plurality of storage components may comprise a plurality of memory cells, and wherein the controller is configured to periodically sample parameter values stored in the plurality of storage components to monitor the state of the radiation particle detector. In this example and/or other examples, the radiation particle detector may comprise a plurality of layers of two-dimensional mesh structures, each two-dimensional mesh structure may comprise a plurality of row electrodes, a plurality of column electrodes, and a plurality of storage components electrically connected at crossing points between the plurality of row electrodes and the plurality of column electrodes, and storage components in different layers may be spatially offset relative to storage components in other layers of the plurality of layers. In this example and/or other examples, the radiation particle detector may comprise a three-dimensional structure that overlays a volume of the payload. In this example and/or other examples, the three-dimensional structure may comprise a plurality of two-dimensional continuous surface structures. In this example and/or other examples, the three-dimensional structure may comprise a plurality of two-dimensional mesh structures. In this example and/or other examples, the controller may be configured to determine a first location of a radiation particle strike on a first surface of the radiation particle detector based on the change in state of the particle detector, determine a second location of the radiation particle strike on a second surface of the radiation particle detector based on the change in state of the particle detector, and determine a location and time of the radiation particle strike on the payload based on a spatial correlation between the first location of the radiation particle strike on the first surface and the second location of the radiation particle strike on the second surface. In this example and/or other examples, the controller may be configured to output radiation particle strike data to the payload indicating the occurrence of a radiation particle strike and the location of the radiation particle strike on the radiation particle detector, and the payload may be configured to perform a mitigation operation based on said radiation particle strike data.

In another example, a method for detecting a radiation particle strike comprises monitoring a state of a radiation particle detector overlayed on at least one surface of a payload that is sensitive to interaction with radiation particles, the radiation particle detector configured to undergo a change in state responsive to a radiation particle strike at a location on the radiation particle detector, detecting a radiation particle strike on the radiation particle detector based on a change in state of the radiation particle detector, and determining a location and time of the radiation particle strike on the radiation particle detector based on the change in state of the particle detector. In this example and/or other examples, the method may further comprise outputting radiation particle strike data to the payload, the radiation particle strike data indicating the occurrence of a radiation particle strike and the location of the radiation particle strike on the radiation particle detector, the payload may be configured to perform a mitigation operation based on the radiation particle strike data. In this example and/or other examples, the radiation particle detector may comprise a two-dimensional mesh structure comprising a plurality of storage components each configured to store a parameter value that changes based on a radiation particle strike occurring at the storage component, and the method further comprise re-setting a parameter value stored in a storage component back to a default value after a designated time duration has elapsed subsequent to a radiation particle strike occurring at the storage component. In this example and/or other examples, the radiation particle detector may comprise a three-dimensional structure that overlays a volume of the payload, and the method may further comprise determining a first location of a radiation particle strike on a first surface of the radiation particle detector based on the change in state of the particle detector, determining a second location of the radiation particle strike on a second surface of the radiation particle detector based on the change in state of the particle detector, determining a location and time of the radiation particle strike on the payload based on a spatial correlation between the first location of the radiation particle strike on the first surface and the second location of the radiation particle strike on the second surface.

In yet another example, a radiation particle strike detection system comprises a radiation particle detector overlayed on at least one surface of a payload that is sensitive to interaction with radiation particles, the radiation particle detector configured to undergo a change in state responsive to a radiation particle strike at a location on the radiation particle detector, and a controller coupled to the radiation particle detector and configured to monitor a state of the radiation particle detector, detect a radiation particle strike on the radiation particle detector based on a change in state of the radiation particle detector, determine a location and time of the radiation particle strike on the radiation particle detector based on the change in state of the particle detector, and output radiation particle strike data indicating the occurrence of a radiation particle strike and the location of the radiation particle strike on the radiation particle detector.

The present disclosure includes all novel and non-obvious combinations and subcombinations of the various features and techniques disclosed herein. The various features and techniques disclosed herein are not necessarily required of all examples of the present disclosure. Furthermore, the various features and techniques disclosed herein may define patentable subject matter apart from the disclosed examples and may find utility in other implementations not expressly disclosed herein.

The invention claimed is:

1. A radiation particle strike detection system comprising:
 a radiation particle detector including a three-dimensional structure that overlays a volume of a payload that is sensitive to interaction with radiation particles, the three-dimensional structure including a plurality of two-dimensional structures overlayed on different surfaces of the payload, the radiation particle detector configured to undergo a change in state responsive to a radiation particle strike at a location on a two-dimensional structure of the plurality of two-dimensional structures of the radiation particle detector; and
 a controller coupled to the radiation particle detector and configured to:
  monitor a state of the radiation particle detector;
  detect a first location of a radiation particle strike on a first two-dimensional structure of the radiation particle detector based on a change in state of the radiation particle detector;
  detect a second location of the radiation particle strike on a second two-dimensional structure of the radiation particle detector based on a change in state of the radiation particle detector; and
  determine a location of the radiation particle strike on the payload based on a spatial correlation between the first location on the first two-dimensional structure and the second location on the second two-dimensional structure of the radiation particle detector and a time of the radiation particle strike based on the change in state of the particle detector.

2. The radiation particle strike detection system of claim 1, wherein the controller is configured to output radiation particle strike data indicating occurrence of the radiation particle strike and the location of the radiation particle strike on the payload.

3. The radiation particle strike detection system of claim 1, wherein one or more of the two-dimensional structures includes a continuous surface.

4. The radiation particle strike detection system of claim 1, wherein one or more of the two-dimensional structures comprises a van der Pauw semiconductor resistor structure comprising a plurality of terminals configured to measure a resistance, and wherein the location of the radiation particle strike on the van der Pauw semiconductor resistor structure is determined based on differences between expected resistances and the resistances measured via the plurality of terminals.

5. The radiation particle strike detection system of claim 4, wherein a difference between an expected resistance and a measured resistance is correlated to a distance between the location of the radiation particle strike on the van der Pauw semiconductor resistor structure and a location of a terminal of the plurality of terminals.

6. The radiation particle strike detection system of claim 1, wherein one or more of the two-dimensional structures comprises a reverse biased p-n junction.

7. The radiation particle strike detection system of claim 1, wherein one or more of the two-dimensional structures includes a two-dimensional mesh structure comprising a plurality of storage components each configured to store a parameter value that changes based on a radiation particle strike occurring at the storage component.

8. The radiation particle strike detection system of claim 7, wherein each of the plurality of storage components is configured such that the parameter value changes back to a default value after a designated time duration has elapsed subsequent to a radiation particle strike occurring at the storage component.

9. The radiation particle strike detection system of claim 7, wherein the plurality of storage components comprises a plurality of memory cells, and wherein the controller is configured to periodically sample parameter values stored in the plurality of storage components to monitor the state of the radiation particle detector.

10. The radiation particle strike detection system of claim 1, wherein the radiation particle detector comprises a plurality of layers of two-dimensional mesh structures, each two-dimensional mesh structure comprising a plurality of row electrodes, a plurality of column electrodes, and a plurality of storage components electrically connected at crossing points between the plurality of rows electrodes and the plurality of column electrodes, and wherein storage components in different layers are spatially offset relative to storage components in other layers of the plurality of layers.

11. The radiation particle strike detection system of claim 1, wherein the three-dimensional structure comprises a plurality of two-dimensional continuous surface structures.

12. The radiation particle strike detection system of claim 1, wherein the three-dimensional structure comprises a plurality of two-dimensional mesh structures.

13. The radiation particle strike detection system of claim 1, wherein the controller is configured to:
output radiation particle strike data to the payload indicating occurrence of the radiation particle strike and the location of the radiation particle strike on the radiation particle detector, and wherein the payload is configured to perform a mitigation operation based on said radiation particle strike data.

14. The radiation particle strike detection system of claim 1, wherein the three-dimensional structure of the radiation particle detector includes one or more two-dimensional mesh structures comprising a plurality of storage components each configured to store a parameter value that changes based on a radiation particle strike occurring at the storage component, and wherein the controller is configured to re-set a parameter value stored in a storage component of the plurality of storage components back to a default value after a designated time duration has elapsed subsequent to a radiation particle strike occurring at the storage component.

15. A method for detecting a radiation particle strike, comprising:
monitoring a state of a radiation particle detector comprising a three-dimensional structure overlayed on a volume of a payload that is sensitive to interaction with radiation particles, the radiation particle detector configured to undergo a change in state responsive to a radiation particle strike at a location on the radiation particle detector;
detecting a radiation particle strike on the radiation particle detector based on a change in state of the radiation particle detector including 1) determining a first location of the radiation particle strike on a first surface of the radiation particle detector based on the change in state of the particle detector, 2) determining a second location of the radiation particle strike on a second surface of the radiation particle detector based on the change in state of the particle detector; and
determining a location and time of the radiation particle strike on the payload based on a spatial correlation between the first location of the radiation particle strike on the first surface and the second location of the radiation particle strike on the second surface.

16. The method of claim 15, further comprising:
outputting radiation particle strike data to the payload, the radiation particle strike data indicating occurrence of the radiation particle strike and the location of the radiation particle strike on the payload, wherein the payload is configured to perform a mitigation operation based on the radiation particle strike data.

17. The method of claim 15, wherein the three-dimensional structure of the radiation particle detector includes one or more two-dimensional mesh structures comprising a plurality of storage components each configured to store a parameter value that changes based on a radiation particle strike occurring at the storage component, and wherein the method further comprises:
re-setting a parameter value stored in a storage component back to a default value after a designated time duration has elapsed subsequent to a radiation particle strike occurring at the storage component.

18. A radiation particle strike detection system comprising:
a radiation particle detector overlayed on at least one surface of a payload that is sensitive to interaction with radiation particles, the radiation particle detector configured to undergo a change in state responsive to a radiation particle strike at a location on the radiation particle detector, the radiation particle detector including a van der Pauw semiconductor resistor structure comprising a plurality of terminals configured to measure a resistance; and a controller coupled to the radiation particle detector and configured to:

monitor a state of the radiation particle detector;

detect a radiation particle strike on the radiation particle detector based on a change in state of the radiation particle detector including a change in resistance measured by one or more of the plurality of terminals of the van der Pauw semiconductor resistor structure;

determine a location and time of the radiation particle strike on the radiation particle detector based on the change in state of the particle detector including differences between expected resistances and the resistances measured via the plurality of terminals; and output radiation particle strike data indicating occurrence of the radiation particle strike and the location of the radiation particle strike on the radiation particle detector.

19. The radiation particle strike detection system of claim 18, wherein the controller is configured to perform a mitigation operation based on the radiation particle strike data.

20. The radiation particle strike detection system of claim 18, wherein a difference between an expected resistance and a measured resistance is correlated to a distance between the location of the radiation particle strike on the van der Pauw semiconductor resistor structure and a location of a terminal of the plurality of terminals.

* * * * *